(12) United States Patent
Tanbakuchi et al.

(10) Patent No.: US 7,518,353 B2
(45) Date of Patent: Apr. 14, 2009

(54) VECTOR NETWORK ANALYSIS SYSTEM AND METHOD USING OFFSET STIMULUS SIGNALS

(75) Inventors: Hassan Tanbakuchi, Santa Rosa, CA (US); Wing J. Mar, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/400,546

(22) Filed: Apr. 7, 2006

(65) Prior Publication Data

US 2007/0236230 A1 Oct. 11, 2007

(51) Int. Cl.
*G01R 25/00* (2006.01)

(52) U.S. Cl. ............ 324/76.77; 324/650; 324/76.12; 324/76.19; 324/76.2; 324/638; 324/601; 324/637; 324/639; 702/85; 702/76

(58) Field of Classification Search ......... 324/650, 324/76.77, 76.12, 76.19, 76.2, 638, 601, 324/637, 639; 702/85, 76
See application file for complete search history.

(56) References Cited

U.S. PATENT DOCUMENTS

| | | | | |
|---|---|---|---|---|
| 4,703,433 | A * | 10/1987 | Sharrit | 702/76 |
| 4,816,767 | A * | 3/1989 | Cannon et al. | 324/601 |
| 4,868,494 | A * | 9/1989 | Ryder et al. | 324/76.33 |
| 5,495,173 | A | 2/1996 | Bockelman et al. | |
| 5,751,153 | A | 5/1998 | Bockelman | |
| 5,793,213 | A | 8/1998 | Bockelman et al. | |
| 5,949,262 | A * | 9/1999 | Dreps et al. | 327/156 |
| 6,636,816 | B1 * | 10/2003 | Dvorak et al. | 702/66 |
| 6,768,390 | B1 | 7/2004 | Dunsmore et al. | |
| 7,002,335 | B2 * | 2/2006 | Shoulders | 324/76.23 |
| 7,034,548 | B2 * | 4/2006 | Anderson | 324/600 |
| 2004/0196925 | A1 * | 10/2004 | Moore et al. | 375/308 |
| 2006/0276982 | A1 * | 12/2006 | Caffrey et al. | 702/65 |

OTHER PUBLICATIONS

Agilent E1432A, E1433A, E1434A, VXI Digitizers/Source Product Overview, Agilent Technologies, 1997, p. 1-28.*

"Understanding Mixed- Mode S-Parameters", Application Note 9902C, ATN Microwave, Inc., date unknown.

David E. Bockelman and William R. Eisenstadt, "Calibration and Verification of the Pure-Mode Vector Network Analyzer," IEEE Trans. on Microwave Theory and Techniques, vol. 46, No. 7, Jul. 1998, pp. 1009-1012.

(Continued)

*Primary Examiner*—Timothy J. Dole
*Assistant Examiner*—Thomas F. Valone

(57) ABSTRACT

A vector network analysis system and a method of measuring use offset stimulus signals to stimulate a balanced device under test (DUT) to determine performance parameters. The system includes an offset stimulus source that provides a plurality of stimulus signals and a vector network analyzer. At least one stimulus signal is offset from another stimulus signal of the plurality in one or both of frequency and time-varying phase. The offset stimulus source includes a first signal source and a second signal source that respectively provides the offset stimulus signals. The method of measuring includes generating the offset stimulus signals and applying the offset stimulus signals to a balanced port of the DUT to stimulate the DUT. The performance parameters are determined from measurements of the offset stimulus signals and one or more response signals from the stimulated DUT.

2 Claims, 6 Drawing Sheets

OTHER PUBLICATIONS

David E. Bockelman, William R. Eisenstadt, and Robert Stengel, "Accuracy Estimation of Mixed-Mode Scattering Parameter Measurements," IEEE Trans. on Microwave Theory and Techniques, vol. 47, No. 1, Jan. 1999, pp. 102-105.

5988-2186EN, "Agilent Measurement Solutions for Balanced Components—Product Overview", Apr. 4, 2001, Agilent Technologies, Inc., pp. 1-12.

5988-2416EN, "Agilent Test Solutions for Multiport and Balanced Devices", May 11, 2001, Agilent Technologies, Inc., pp. 1-8.

5988-5635EN, "Multiport & Balanced Decive Measurement Application Note Series—Concepts in Balanced Device Measurements", Application Note 1373-2, Mar. 8, 2002, Agilent Technologies, Inc., pp. 1-12.

5988-5634EN, "Multiport and Balanced Device Measurement Application Note Series—An Introduction to Multiport and Balanced Device Measurements", Application Note 1373-1, Nov. 11, 2002, Agilent Technologies, Inc., pp. 1-12.

David E. Bockelman and William R. Eisensradt, "Combined Differential and Common-Mode Scattering Parameters: theory and Simulation", IEEE Trans. Microwave Theory Tech., vol. 43, No. 7, Jul. 1995, pp. 1530-1539.

David E. Bockelman and William R. Eisensradt, "Pure-Mode Network Analyzer for On-Wafer Measurements of Mixed-Mode S-Parameters of Differential Circuits", IEEE Trans. Microwave Theory Tech., vol. 45, No. 7, Jul. 1997, pp. 1071-1077.

* cited by examiner

VECTOR NETWORK ANALYSIS SYSTEM AND METHOD USING OFFSET STIMULUS SIGNALS

CROSS-REFERENCE TO RELATED APPLICATIONS

N/A

STATEMENT REGARDING FEDERALLY SPONSORED RESEARCH OR DEVELOPMENT

N/A

BACKGROUND

Balanced devices operating at high frequencies including, but not limited to, microwave frequencies, are becoming more and more prevalent in modern systems, especially communication systems. Concomitant with the use of such devices is a need to measure a performance of balanced devices. As with single-ended (i.e., non-balanced) microwave devices, balanced microwave devices may be characterized using S-parameters. However, in the case of balanced devices, so-called 'mixed mode' S-parameters are generally used to characterize the device instead of the conventional or single-ended S-parameters. Mixed mode S-parameters relate differential and common mode signals, which are applied to ports of the balanced device, to differential and common mode responses at the ports.

Conceptually, a multiport vector network analyzer (VNA) that provides a single-ended (e.g., non-differential) stimulus signal to a device under test (DUT) may be used to measure mixed-mode S-parameters of a balanced DUT. Specifically, since a balanced device may be viewed as a generalized multiport device, the multiport VNA may be used to measure mixed-mode S-parameters of the balanced DUT by applying a single-ended signal separately to each port of the balanced DUT and measuring a set of single-ended S-parameters for each port. After applying and measuring is performed for each port, a complete set of single-ended S-parameters is produced. The complete set of measured single-ended S-parameters then can be converted to mixed-mode S-parameters using modal decomposition to completely characterize a balanced device. See for example, Bockelman et al., U.S. Pat. Nos. 5,495,173 and 5,751,153, incorporated herein by reference.

Unfortunately, some balanced devices, especially active balanced devices and those exhibiting certain non-linearities, behave differently in response to a single-ended stimulus signal than to a true differential stimulus signal. Therefore, the single ended S-parameters measured by the conventional VNA may not accurately reflect a performance of the balanced device in the presence of a differential stimulus signal. In a worst case, the balanced device may even fail to operate (e.g., become unstable resulting in unwanted oscillations) or be damaged when presented with a single-ended stimulus signal.

To address the measurement of such balanced devices, various approaches have been developed that seek to directly measure the mixed-mode S-parameters of a balanced DUT using true or simulated differential stimulus signals. Among the various approaches are methods employing a broadband balun (i.e., either physical or simulated balun) and methods using a hybrid junction. Each of these methods employs a device (e.g., a balun or a hybrid junction) between the VNA and the DUT to essentially transform the single-ended stimulus signal into a differential signal. In another approach, a pure mode network analyzer (see Bockelman et al., cited supra) employs as a stimulus signal source a composite signal generator that sequentially switches between a common-mode (i.e., in-phase) stimulus signal and a differential-mode (i.e., out of phase) stimulus signal.

BRIEF SUMMARY

In some embodiments of the present invention, a vector network analysis system is provided. The vector network analysis system comprises an offset stimulus source providing a plurality of stimulus signals. At least one stimulus signal of the plurality is offset from another stimulus signal of the plurality in one or both of frequency and time-varying phase. The vector network analysis system further comprises a vector network analyzer connected between the offset stimulus source and a balanced device under test. The balanced device under test is stimulated by the plurality of stimulus signals at a balanced input to determine performance parameters of the balanced device under test.

In other embodiments, an offset stimulus source that stimulates a device under test is provided. The offset stimulus source comprises a first signal source providing a first stimulus signal and a second signal source providing a second stimulus signal. The second stimulus signal is offset in one or both of frequency and time-varying phase from the first stimulus signal. The first stimulus signal and the second stimulus signal provide stimulation to a balanced input port of the device under test to determine performance parameters for the device under test.

In other embodiments, a multiport vector network analyzer that measures performance parameters of a balanced device under test is provided. The multiport vector network analyzer comprises an offset stimulus source providing a pair of stimulus signals. A second stimulus signal of the pair is offset in one or both of frequency and time-varying phase from a first stimulus signal of the pair. The multiport vector network further comprises an acquisition module connected between the output of the offset stimulus source and ports of the analyzer. The acquisition module provides the pair of stimulus signals to an input port of the balanced device under test and receives response signals from the balanced device under test. The provided stimulus signals stimulate the input port of the balanced device under test.

In yet other embodiments, a method of measuring a balanced device under test is provided. The method of measuring comprises generating offset stimulus signals that are offset in one or both of frequency and time-varying phase from one another. The method of measuring further comprises applying the offset stimulus signals to a balanced port of the balanced device under test to stimulate the balanced device under test; and determining performance parameters for the stimulated balanced device under test. The performance parameters are determined from measurements of the offset stimulus signals and measurements of one or more response signals from the stimulated balanced device under test.

Certain embodiments of the present invention have other features that are one or both of in addition to and in lieu of the features described above. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

The embodiments of the present invention facilitate characterizing network parameters of a multiport device under test (DUT) such as, but not limited to, a differential or balanced DUT. In particular, the present invention generates and applies a plurality of stimulus signals as input signals to the multiport DUT. The plurality of stimulus signals stimulates the multiport DUT according to multiple modes of the input signals including, but not limited to, a common mode (i.e., an in-phase mode) and a differential mode (i.e., out-of-phase mode). As such, the plurality of stimulus signals essentially represents or provides a multi-modal stimulation or excitation of the multiport DUT. Measurements of each signal of the plurality of stimulus signals and corresponding measurements of responses (e.g., transmission and reflection responses) at various ports of the multiport DUT provide direct characterization of the multiport DUT performance in the presence of the multi-modal stimulus. In particular, mixed mode S-parameters associated with common mode stimulation and differential mode stimulation may be determined from the measurements. Additionally, the multiport DUT performance may be characterized in terms of other input signal modes using the multi-modal stimulus/response measurements according to the present invention.

As used herein with respect to a pair of stimulus signals, the term 'common mode' refers to a first stimulus signal that is in phase with a second stimulus signal of the pair. In other words, common mode implies that a relative phase difference between the stimulus signals is essentially zero. Moreover, the term 'differential mode' is defined to mean the signals of the pair of stimulus signals are essentially 180 degrees out of phase. Other modes applicable to the pair of stimulus signals may be defined by other relative phase differences between the signals (e.g., quadrature mode having a 90-degree phase difference).

Figure 1:
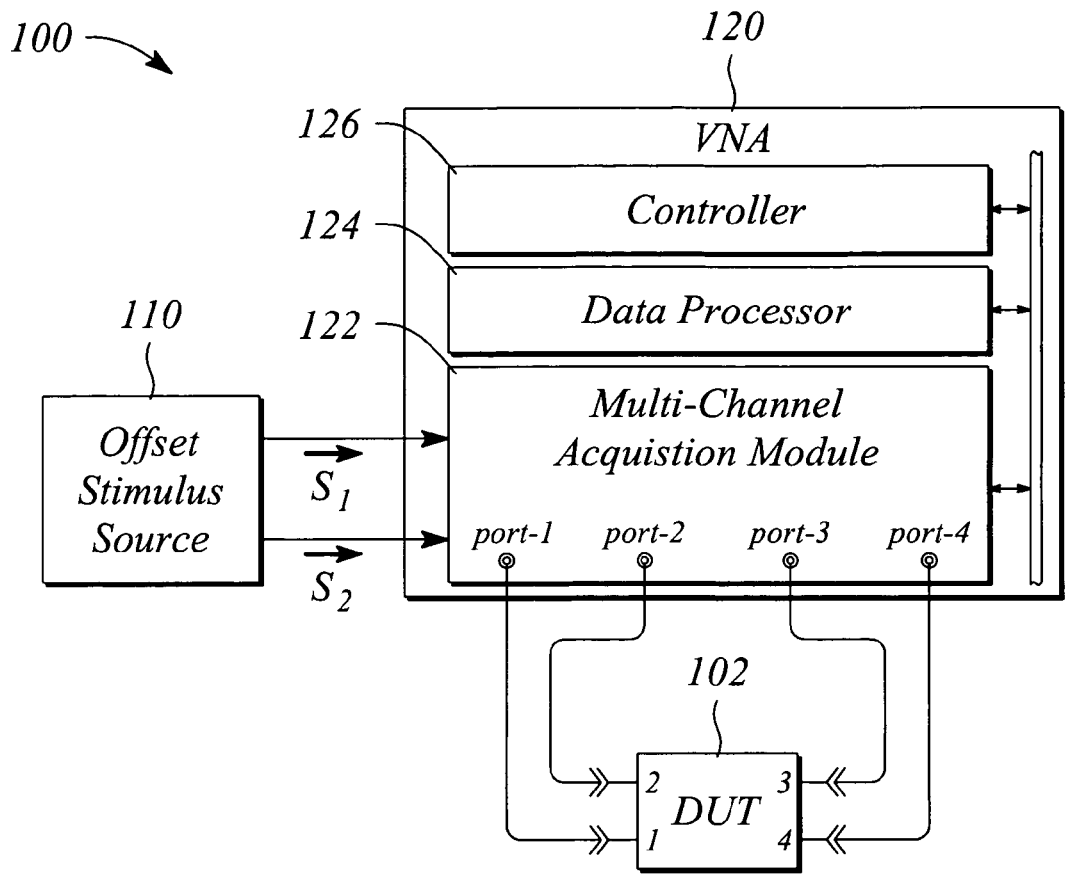
FIG. 1 illustrates a block diagram of a vector network analysis system employing multi-modal stimulus signals according to an embodiment of the present invention.

FIG. 1 illustrates a block diagram of a vector network analysis system 100 employing multi-modal stimulus signals according to an embodiment of the present invention. In some embodiments, the multiple modes of the multi-modal signals are implemented or realized by signals that are offset from one another in one or more of frequency and time-varying phase. As such, the multi-modal stimulus signals are also referred to as 'offset stimulus signals' herein. The vector network analysis system 100 (also referred to herein as 'test system 100') applies a multi-modal stimulus to input ports of a device under test (DUT) 102. Measurements of responses to the multi-modal stimulus characterize a performance of the DUT 102.

As illustrated in FIG. 1, the vector network analysis or test system 100 comprises an offset stimulus source 110. The offset stimulus source 110 generates a pair of offset stimulus signals. In various embodiments, a first stimulus signal $S_1$ of the pair is offset one or both of in frequency and in phase relative to a second stimulus signal $S_2$ of the pair. Depending on the embodiment, the relative offset may be constant or time-varying. For example, the second signal $S_2$ may have a frequency that is offset relative to a frequency of the first signal $S_1$. In another example, the second signal $S_2$ may have a phase that is offset as a function of time (i.e., time-varying phase offset) relative to a phase of the first signal $S_1$. In yet another example, a relative frequency offset between the first and second signals $S_1$, $S_2$ may vary as a function of time.

As such, 'offset stimulus signals' are defined herein as a plurality of signals, one or more of which being offset in one or both of frequency and time-varying phase from at least one other signal of the plurality. Further, as defined herein, a frequency offset may be either constant or time varying.

The offset stimulus source 110 simultaneously provides the first signal $S_1$ at a first output port and the second signal $S_2$ at a second output port of the offset stimulus source 110. In some embodiments, the first and second signals $S_1$, $S_2$ are derived from or phase locked to a common reference signal. In other embodiments, the second signal $S_2$ is either derived from or phase locked to the first signal $S_1$.

Consider for example and not by way of limitation, an exemplary first signal $S_1$ having a frequency $f_1$ and an exemplary second signal $S_2$ having a frequency $f_2$ where the signals are offset in frequency by an offset frequency $\Delta f$. The second signal frequency $f_2$ is given in terms of the first signal frequency $f_1$ by the equation $$f_2 = f_1 \pm \Delta f \tag{1}$$

where the offset frequency $\Delta f$ represents either a positive (+) or negative (−) offset or frequency shift relative to the first signal frequency $f_1$. In general, the offset frequency $\Delta f$ may be essentially any constant frequency or any time-varying function of frequency. In some embodiments, the offset frequency $\Delta f$ is a fraction of the first signal frequency $f_1$. For example and not by way of limitation, where the first signal frequency $f_1$ is in a microwave range (e.g., 1-20 GHz), the offset frequency $\Delta f$ may be on the order of 1 kHz to 20 MHz. In another non-limitative example, the offset frequency $\Delta f$ is a frequency in a range spanning approximately 1 kHz to 10 kHz. A smaller offset frequency $\Delta f$ (e.g., kHz range) may improve an accuracy of a measurement in some embodiments. In other embodiments, a somewhat larger offset frequency $\Delta f$ (e.g., MHz range) may be somewhat more readily achieved in practice especially when dealing with a first signal frequency $f_1$ in microwave frequency range (e.g., GHz range).

Figure 2A:
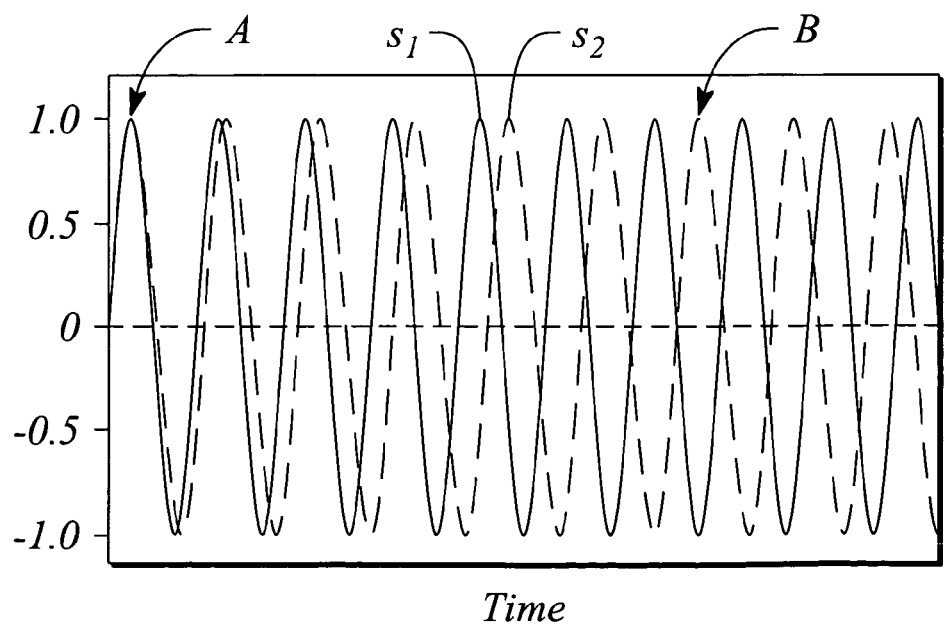
FIG. 2A illustrates a plot of pair of frequency offset sinusoids $s_1$, $s_2$ according to an embodiment of the present invention.

FIG. 2A illustrates a plot of a pair of frequency offset sinusoids $s_1$, $s_2$ according to an embodiment of the present invention. The sinusoids $s_1$, $s_2$ represent and correspond to exemplary ones of the first and second stimulus signals $S_1$, $S_2$, respectively. In particular, as illustrated in FIG. 2A, the sinusoid $s_1$ has a frequency $f_1$ while the sinusoid $s_2$ has a frequency $f_2$ that is offset from the frequency $f_1$ by offset frequency $\Delta f$. Also illustrated in FIG. 2A is a time point A where the sinusoids $s_1$, $s_2$ are instantaneously in-phase and a time point B where the sinusoids $s_1$, $s_2$ are instantaneously 180 degrees out of phase.

Figure 2B:
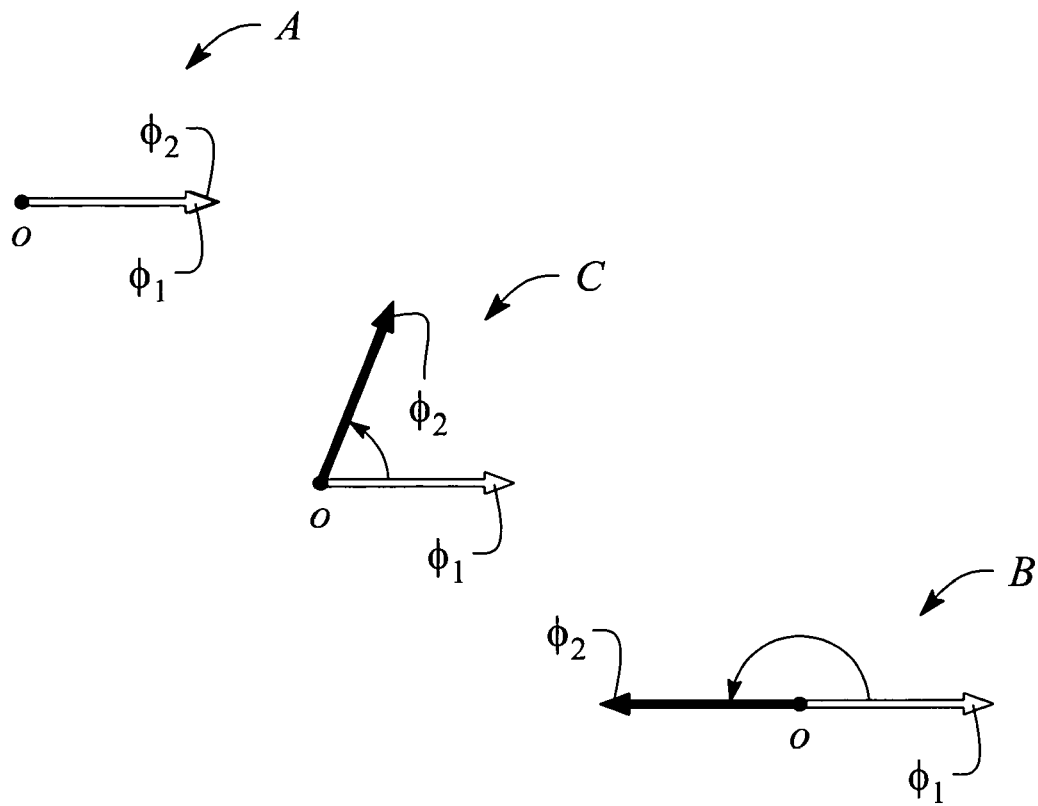
FIG. 2B illustrates diagrams of an instantaneous phase of the sinusoids $s_1$, $s_2$ illustrated in FIG. 2A.

FIG. 2B illustrates diagrams of an instantaneous phase of the sinusoids $s_1$, $s_2$ illustrated in FIG. 2A. In particular, in FIG. 2B, respective instantaneous phases of the sinusoids $s_1$, $s_2$ are illustrated as a pair of rotating phasors $\phi_1$, $\phi_2$ rotating about an origin O at three different points in time. Further, the phasor $\phi 2$ corresponding to sinusoid $s_2$ rotates at a rate that differs from the phasor $\phi_1$ corresponding to sinusoid $s_1$. The difference is established by the offset frequency $\Delta f$. For simplicity of understanding and not by way of limitation, only a relative rotation of the phasors $\phi_1$, $\phi_2$ is illustrated in FIG. 2B (e.g., a position of phasor $\phi_1$ is held constant).

As illustrated in FIG. 2B, at a first time point labeled A and corresponding to point A in FIG. 2A, the phasors $\phi_1$, $\phi_2$ line up with or lie on top of one another indicating that the sinusoids $s_1$, $s_2$ are in phase. At a second point in time labeled C in FIG. 2B, the phasors $\phi_1$, $\phi_2$ have rotated to be out of alignment. At a third time point labeled B and corresponding to point B in FIG. 2A, a relative position of the phasors $\phi_1$, $\phi_2$ has again changed such that the phasors $\phi_1$, $\phi_2$ point in opposite directions indicating that the sinusoids $s_1$, $s_2$ are 180 degrees out of phase.

As illustrated in FIGS. 2A and 2B respectively, point A essentially represents relationship present in a common mode stimulus signal while point B represents a relationship present in a differential mode stimulus signal. In addition, essentially any other mode between common mode and differential mode is also present in the pair of frequency offset sinusoids. Such other mode is exemplified by the sinusoids $s_1$, $s_2$ and the corresponding phasors $\phi_1$, $\phi_2$ at time point C illustrated in FIGS. 2A and 2B.

Consider another exemplary first signal $S_1$ and an exemplary second signal $S_2$ each having a frequency $f_0$ where the signals $S_1$, $S_2$ are offset in phase. The exemplary first and second signals $S_1$, $S_2$ with phase offset may be described by the equation $$S_1 = \sin(2\pi f_0 t) \quad S_2 = \sin(2\pi f_0 t + \Delta\phi(t)) \tag{2}$$

where $\Delta\phi(t)$ is an offset phase having a time-varying function. Such a time-varying offset phase $\Delta\phi(t)$ is often called a 'chirped' phase offset. For example, the offset phase $\Delta\phi(t)$ may vary as a quadratic function of time (e.g., $\Delta\phi(t)=\alpha \cdot t^2$, where $\alpha$ is an arbitrary constant). A time-varying offset phase that is a linear function of time (e.g., $\Delta\phi(t)=\alpha \cdot t$) is essentially similar to and indistinguishable from the constant frequency offset described above. In general, the offset phase $\Delta\phi(t)$ may be essentially any function of time including a constant function of time.

The offset stimulus source 110 may be implemented using essentially any dual-output signal source compatible with stimulating the DUT 102. In some embodiments, the offset stimulus source 110 comprises a pair of frequency or signal sources that are phase locked. For example, the phase locked signal sources may be locked to a common reference source. In another example, a second signal source (e.g., slave source) of the pair is phase locked to a first signal source (e.g., master source) of the pair. Phase locking the signal sources essentially insures that a phase relationship between the signal sources is a controlled quantity and not random or arbitrary. While the phase relationship between the signal sources is a controlled quantity, a time-varying phase offset may be implemented in such phase locked signal sources by introducing a controllable phase offset.

The phase locked signal source(s) may be phase locked using a phase locked loop (PLL), for example. In some embodiments, a fractional-N PLL synthesizer is employed as one or both of the phase locked signal sources, as described further below. Fractional-N PLL synthesizers are known in the art as being capable of achieving fine frequency tuning resolution of an output signal.

Figure 3:
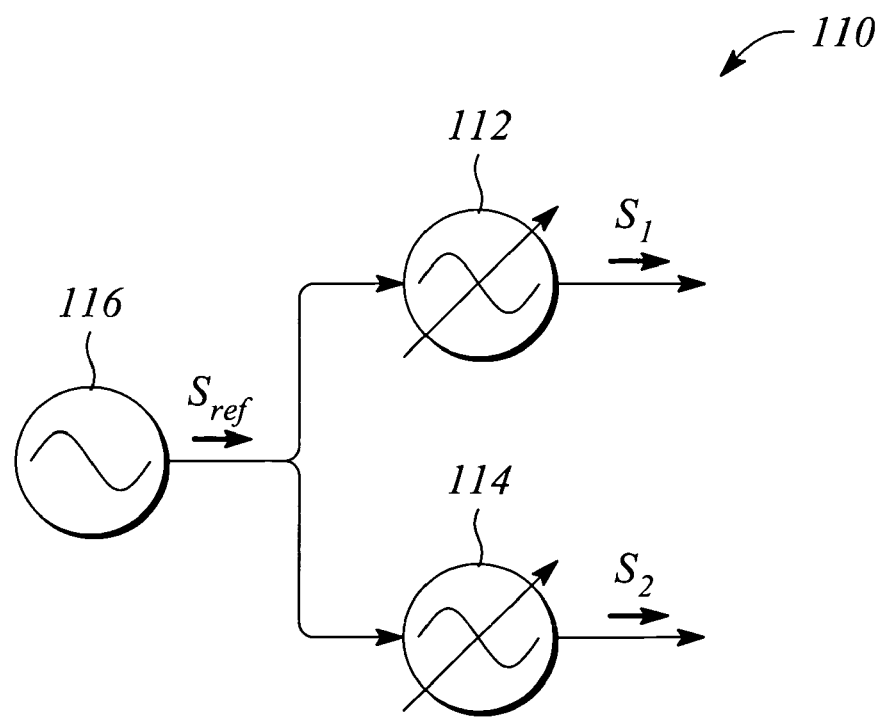
FIG. 3 illustrates a block diagram of an offset stimulus source according to an embodiment of the present invention.

FIG. 3 illustrates a block diagram of an offset stimulus source 110 according to an embodiment of the present invention. The offset stimulus source 110 illustrated in FIG. 3 comprises a first frequency or signal source 112 and a second frequency or signal source 114. The first frequency source 112 generates the first stimulus signal $S_1$ while the second frequency stimulus source 114 generates the second stimulus signal $S_2$. In some embodiments, the first and second frequency sources 112, 114 provide respective stimulus signals $S_1$, $S_2$, a frequency f of each may be one or more of swept, stepped and otherwise varied across a range of frequencies. For example, the frequency f of the respective stimulus signals $S_1$, $S_2$ may be stepped across a microwave band from 500 MHz to 20 GHz, or more. As described above, the stimulus signals $S_1$, $S_2$ produced by the first and second frequency sources 112, 114 are offset from one another in one or both of frequency and phase. In some embodiments, the first and second frequency or signal sources 112, 114 are oscillators such as, but not limited to a voltage controlled oscillator.

The offset stimulus source 110 further comprises a reference source 116. The reference source 116 may be a high stability low phase noise source such as, but not limited to, a crystal oscillator, for example. The first and second frequency sources 112, 114 illustrated in FIG. 3, each receives and is phase locked to a reference signal $S_{ref}$ from the reference source 116. For example and not by way of limitation, the reference source 116 may produce a 10 MHz reference signal to which the first and second signal sources 112, 114 are respectively phase locked.

In some embodiments, a fractional-N PLL synthesizer is employed as one or both of the first frequency source 112 and the second frequency source 114. For example, the first frequency source 112 may comprise a first fractional-N PLL synthesizer 112 while the second frequency source 114 may comprise a second fractional-N PLL synthesizer 114. For a frequency offset between the stimulus signals $S_1$, $S_2$, a fractional-N divider modulus (e.g., $N.F_1$) of the first fractional-N PLL synthesizer 112 is set to a different value than a fractional-N divider modulus (e.g., $N.F_2$) of the second fractional-N PLL synthesizer 114. The divider modulus difference essentially establishes a frequency offset between the first and second stimulus signals $S_1$, $S_2$. Each of the fractional-N PLL synthesizers 112, 114 is locked to an output signal of the reference source 116 so the synthesizers 112, 114 maintain a controlled phase relationship with one another (i.e., phase-locked).

Figure 4:
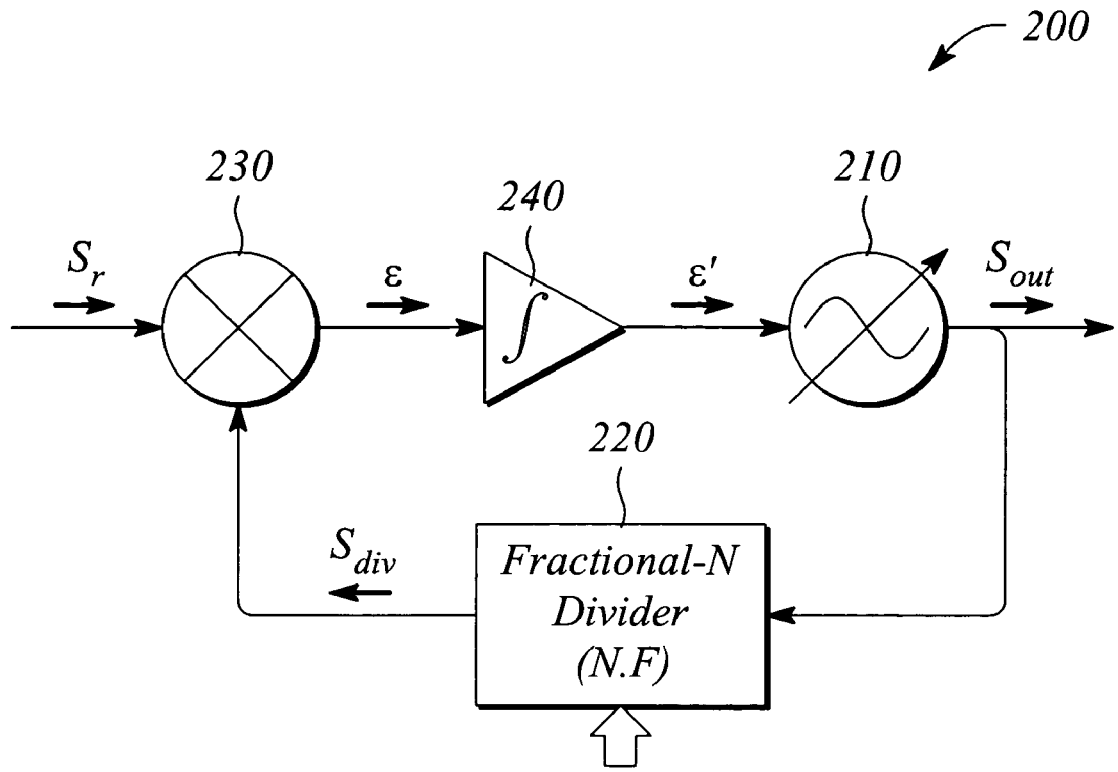
FIG. 4 illustrates a block diagram of an exemplary fractional-N PLL synthesizer according to an embodiment of the present invention.

FIG. 4 illustrates a block diagram of an exemplary fractional-N PLL synthesizer 200 according to an embodiment of the present invention. The exemplary fractional-N PLL synthesizer 200 illustrated in FIG. 4 may be used to implement or realize one or both of the first frequency source 112 and the second frequency source 114. As illustrated in FIG. 4, the exemplary fractional-N PLL synthesizer 200 comprises a voltage controlled oscillator 210 having an output connected to an output of the fractional-N PLL synthesizer 200, a phase comparator 230 having a first input connected to an input of the fractional-N PLL synthesizer 200, a fractional-N divider 220 connected between the output of the voltage controlled oscillator 210 and a second input of the phase comparator 230, and a loop filter 240 connected between an output of the phase comparator 230 and an input of the voltage controlled oscillator 210. The voltage controlled oscillator (VCO) 210 produces an output signal $S_{out}$, a sample of which is applied to an input of the fractional-N divider 220. The fractional-N divider 220 produces a divided signal $S_{div}$ having a frequency $f_{div}$ that is a fractional value of a frequency $f_{out}$ of the sampled output signal $S_{out}$. The fractional value is set by the fractional-N divider modulus N.F, which allows a non-integer divide ratio.

The divided signal $S_{div}$ is applied to the second input of the phase comparator 230. The phase comparator 230 further receives a reference signal $S_r$ at the first input and produces, as an output, a phase error $\epsilon$ representing a difference between an instantaneous phase of the reference signal $S_r$ and an instantaneous phase of the divided signal $S_{div}$. The phase error $\epsilon$ is applied to and filtered by the loop filter 240 to produce a filtered phase error $\epsilon'$. The filtered phase error $\epsilon'$ is, in turn, applied to a frequency control input of the VCO 210. Hence, a feedback loop is created that acts to drive the VCO 210 such that the output signal frequency $f_{out}$ is equal to a frequency $f_r$ of the reference signal $S_r$ multiplied by the fractional-N divider modulus.

The fractional-N divider modulus (e.g., often denoted '$N_0/N_1$' or 'N.F') is controlled by a control input to the fractional-N divider 220. For example, in some embodiments, the fractional-N divider 220 divides the output signal frequency $f_{out}$ according to a first integer divider modulus $N_0$ for a first period of time $\Delta t_1$ and a second integer divider modulus $N_1$ for a second period of time $\Delta t_2$. An actual fractional-N divider modulus is essentially a time-average of the two integer divider modulus $N_0$, $N_1$, for example. One or both of a ratio of the time periods $\Delta t_1$, $\Delta t_2$ and the integer divider moduli $N_0$, $N_1$ is adjusted using the control input, such that essentially any divider modulus value between integer values $N_0$ and $N_1$ may be achieved. When denoted 'N.F', the 'N' typically indicates an integer portion and 'F' denotes a fractional portion of the modulus N.F, respectively.

One skilled in the art is familiar with a wide variety of fractional-N divider and fractional-N synthesizer implementations, all of which are within the scope of the various embodiments of the present invention. For example, the fractional-N divider 220 of the fractional-N synthesizer 200 may be implemented using one or more sigma-delta modulators to achieve the fractional-N divider modulus. In such exemplary implementations (not illustrated), a fractional-N controller may be employed to essentially frequency-shift switching noise or spurs to a high frequency to facilitate removal of the noise using a filter. Furthermore, the skilled artisan will readily recognize that a time-varying phase offset may be achieved in the fractional-N PLL synthesizer 200 by introducing a time-varying offset value into either the phase error $\epsilon$ or filtered phase error $\epsilon'$ signals, for example, and still be within the scope of the various embodiments of the present invention.

In addition to the exemplary fractional-N synthesizer 200 (also known as a single loop synthesizer) described above, other synthesizers may be employed to realize one or both of the first frequency source 112 and the second frequency source 114 of the offset stimulus source 110 according to the present invention. Essentially any synthesizer technique including, but not limited to, frequency multiplication, frequency division, frequency mixing, direct digital synthesis, and combinations thereof, may be employed to realize a frequency synthesizer for use in the offset stimulus source 110. In some embodiments, when any other synthesizer is used to realize and implement the offset stimulus source 110, the other synthesizer is based on, derived from, or directly phase-locked to a reference source 116, as described above with respect to the fractional-N synthesizer 200. As such, the offset stimulus source 110 may be considered a dynamic phase lock system.

Figure 5:
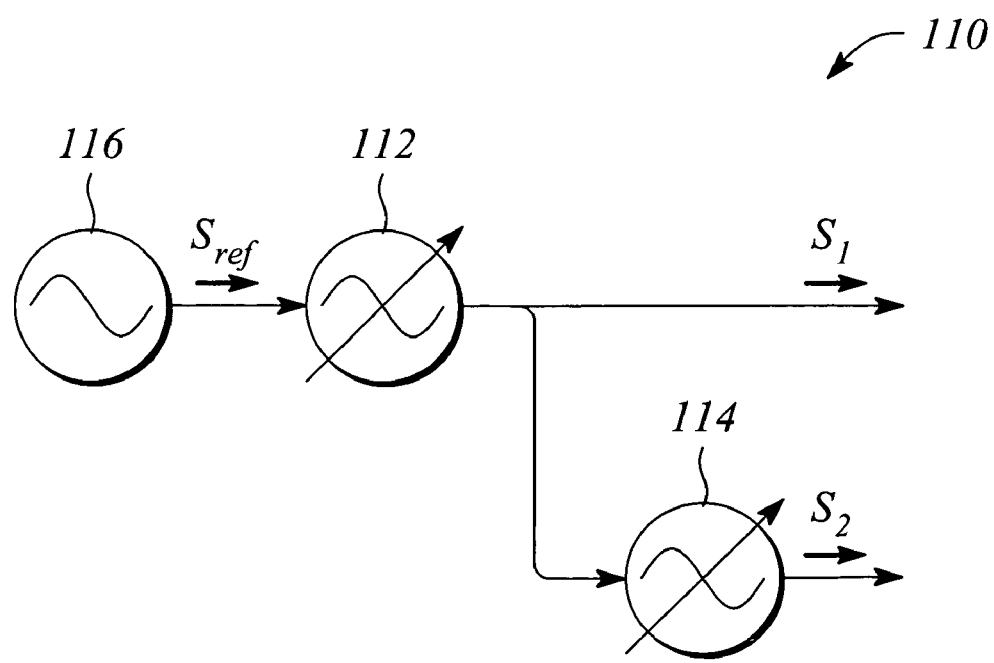
FIG. 5 illustrates a block diagram of an offset stimulus source according to another embodiment of the present invention.

FIG. 5 illustrates a block diagram of an offset stimulus source 110 according to another embodiment of the present invention. As illustrated in FIG. 5, the offset stimulus source 110 comprises a first frequency source 112. The first frequency source 112 generates the first stimulus signal $S_1$. The offset stimulus source 110 further comprises a second frequency source 114 that is phase-locked to the first frequency source 112. As such, the offset stimulus source 110 illustrated in FIG. 5 may be referred to as a 'master/slave' configuration where the first frequency source 112 is referred to as 'master' source and the second frequency source 114 is termed a 'slave' source. The first stimulus signal $S_1$ is sampled by a power divider or coupler for example. The sample of the first stimulus signal $S_1$ is used as a reference signal to which the second frequency source 114 is phase-locked. For example, the second source 114 may be a fractional-N PLL synthesizer 200 designed to lock to the first stimulus signal $S_1$ where the first stimulus source 112 is any other source including, but not limited to, another fractional-N PLL synthesizer 200. The offset stimulus source 110 may further comprises a reference source 116 that is used to phase lock the first or "master" frequency source 112. As described above, the stimulus signals $S_1$, $S_2$ produced by the first and second frequency sources 112, 114, as illustrated in FIG. 5, are offset from one another in one or both of frequency and phase.

Figure 6:
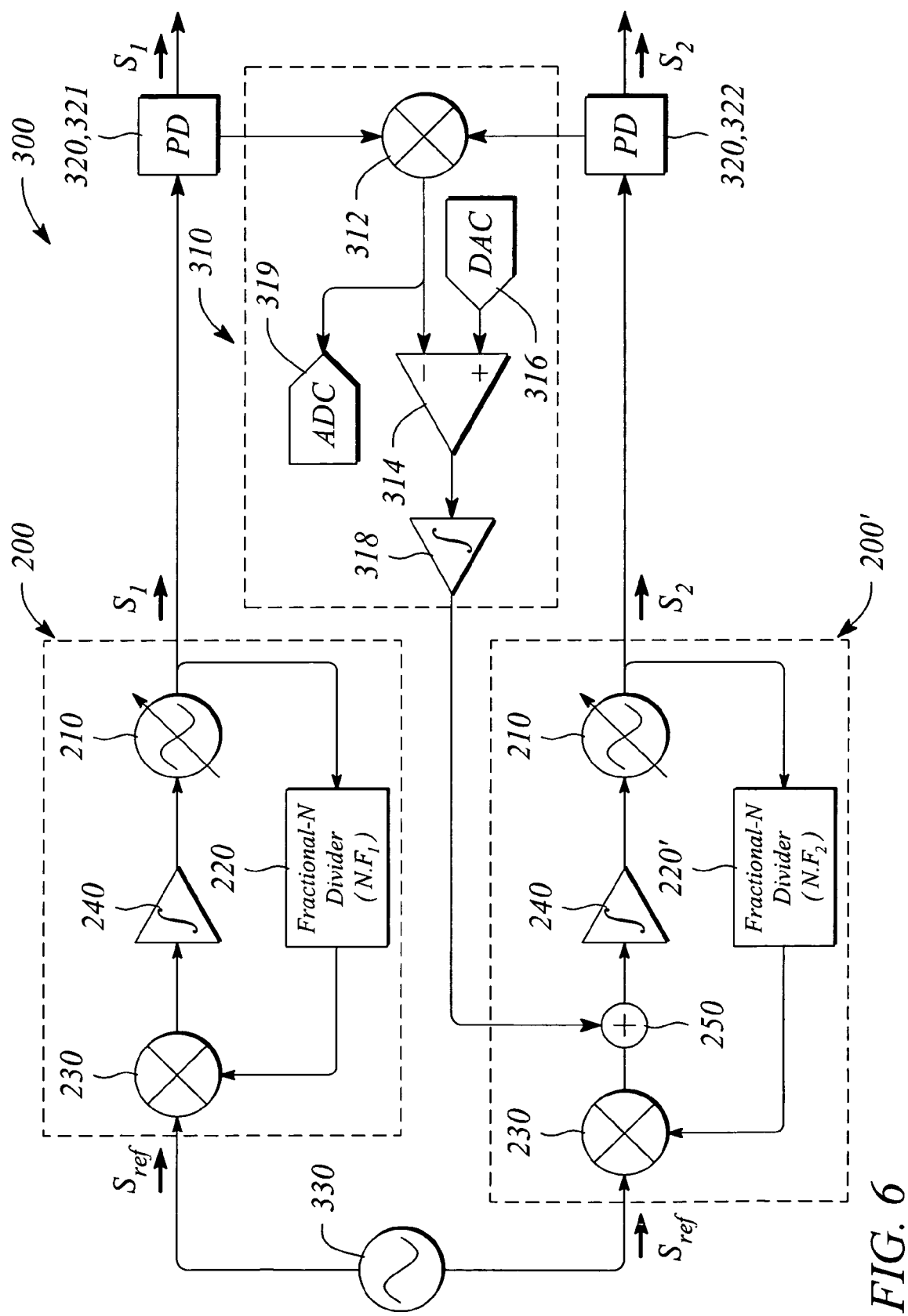
FIG. 6 illustrates a block diagram of an offset frequency source according to an embodiment of the present invention.

FIG. 6 illustrates a block diagram of an offset frequency or signal source 300 according to an embodiment of the present invention. In some embodiments, the offset frequency source 300 may be employed in the vector network analysis system 100 as the offset stimulus source 110. In particular, the offset frequency source 300 illustrated in FIG. 6 produces a pair of frequency offset stimulus signals $S_1$, $S_2$. Additionally, the offset frequency source 300 provides a controllable phase offset $\Delta\phi$ between the frequency offset stimulus signals $S_1$, $S_2$. Among other things, the controllable phase offset $\Delta\phi$ is useful for calibrating the vector network analysis system 100 according to some embodiments. Further, the controllable phase offset $\Delta\phi$ provided by the offset frequency source 300 may be used to introduce a time-varying phase offset $\Delta\phi(t)$ into the stimulus signals $S_1$, $S_2$, in addition to the frequency offset.

As illustrated in FIG. 6, the offset frequency source 300 comprises a pair of synthesizers 200, 200', which are fractional-N PLL synthesizers in the embodiment illustrated in FIG. 6. A first synthesizer 200 of the pair produces the first stimulus signal $S_1$ at a first frequency $f_1$ according to a first fractional-N divider modulus $N.F_1$. The first synthesizer 200 comprises a first of the voltage controlled oscillator 210, a first of the fractional-N divider 220, a first of the phase comparator 230, and a first of the loop filter 240, arranged and operating as described above with respect to FIG. 4. In particular, the first fractional-N divider 240 provides the first fractional-N divider modulus $N.F_1$. The first synthesizer 200 is phase locked to a reference signal $S_{ref}$ (for example and not by way of limitation, 10 MHz).

The second synthesizer 200' produces the second stimulus signal $S_2$ at a second frequency $f_2$ according to a second fractional-N divider modulus $N.F_2$. The second synthesizer 200 comprises a second of the voltage controlled oscillator 210, a fractional-N divider 220', a second of the phase comparator 230, and a second of the loop filter 240. The fractional-N divider 220' provides the second fractional-N divider modulus $N.F_2$. The second synthesizer 200' further comprises a summer 250 between the second phase comparator 230 and the second loop filter 240. The second synthesizer 200' is phase locked to the reference signal $S_{ref}$ also. The elements of the second synthesizer 200' are arranged as described above with respect to FIG. 4, but for the inclusion and the effect of the summer 250.

The summer 250 adds or sums an offset value into the phase error $\epsilon$ to produce the controlled phase offset $\Delta\phi$. By changing an amount of the offset value added by the summer 250, the controlled phase offset $\Delta\phi$ may be adjusted. In some embodiments, the range of phase offset $\Delta\phi$ controllability provided by the adjustment corresponds to an actual phase adjustment range in the second signal $S_2$ of 0 radians to $2\pi$ radians (i.e., 0-360 degrees).

As illustrated in FIG. 6, the offset frequency source 300 further comprises a phase offset controller 310 connected between respective outputs of the first and second synthesizers 200, 200'. The phase offset controller 310 has an output connected to an input of the summer 250. The phase offset controller 310 generates the offset value used by the summer 250 to control the controllable phase offset $\Delta\phi$. In some embodiments, the offset value is a controllable voltage level that is proportional to a phase difference between the stimulus signals $S_1$, $S_2$.

As illustrated in FIG. 6, the phase offset controller 310 comprises a phase comparator 312. For example, the phase comparator 312 may be a mixer having an RF input, an LO input, and an IF output. The phase comparator 312 receives a sample of the first stimulus signal $S_1$ from the first synthesizer 200 at a first input (e.g., RF input). The phase comparator 312 further receives at a second input (e.g., LO input) a sample of the second stimulus signal $S_2$ from the second synthesizer 200'. The phase comparator 312 generates at an output (e.g., IF output) a phase difference signal proportional to a difference in an instantaneous phase of the first and second stimulus signals $S_1$, $S_2$.

The phase offset controller 310 further comprises a voltage comparator 314. The voltage comparator 314 receives the phase difference signal from the phase comparator 312. The phase difference signal is compared to an offset goal signal. In some embodiments, the phase difference signal and the offset goal signal are applied respectively to a negative (−) input and a positive (+) input of the voltage comparator 314. In such embodiments, the voltage comparator 314 produces or generates an output signal that is proportional to a difference between the phase difference signal and the offset goal signal.

In some embodiments, the phase offset controller 310 further comprises a loop digital to analog converter (DAC) 316. The loop DAC 316 converts a digital input defining an offset goal into the offset goal signal. An output of the loop DAC 316 is connected to the positive (+) input of the voltage comparator 314, in some embodiments. The offset goal represents a controllable input to the phase offset controller 310 and is ultimately used to establish and adjust the controlled phase offset $\Delta\phi$.

The phase offset controller 310 further comprises an integrator 318. The integrator 318 integrates the output signal of the voltage comparator 314. In some embodiments, the integrator 318 essentially smoothes or filters the voltage comparator 314 output signal. An output of the integrator 318 is connected to the input of the summer 250. The integrated output signal is essentially the offset value employed by the summer 250.

In some embodiments, the phase offset controller 310 further comprises a loop analog-to-digital converter (ADC) 319. The loop ADC 319 converts the phase difference signal from the phase comparator 312 into a digital format. The digital format of the phase difference signal is available as an output of the phase offset controller 310. For example, the digital phase difference signal may be used by a system controller (not illustrated in FIG. 6) to monitor an operation or a performance of the phase offset controller 310.

In some embodiments, the offset frequency source 300 further comprises a pair 320 of power dividers 321, 322. A first power divider 321 of the pair 320 is located between the output of the first fractional-N synthesizer 200 and a first output of the offset frequency source 300. The first power divider 321 samples the first stimulus signal $S_1$ and routes the sample to the first input (e.g., the RF input) of the phase comparator 312 of the phase controller 310. A second power divider 322 of the pair 320 is located between the output of the second fractional-N synthesizer 200' and a second output of the offset frequency source 300. The second power divider 322 samples the second stimulus signal $S_2$ and routes the sample to the second input (e.g., LO input) of the phase comparator 312 of the phase controller 310. The power dividers 320 may be resistive power dividers in some embodiments. In other embodiments, essentially any other type power divider or signal coupler known in the art may be employed as the power dividers 321, 322.

The offset frequency source 300 further comprises a reference source 330. The reference source 300 is essentially similar to the reference source 116 described above with respect to the vector network analysis system 100. In some embodiments, the reference source 330 is a high stability low phase noise source such as, but not limited to, a crystal oscillator, for example. An output of the reference source 330 is provided to the first and second synthesizers 200, 200' as the reference signal $S_{ref}$ (for example and not by way of limitation, 5 MHz or 10 MHz reference signal).

In some embodiments, the offset frequency source 300 further comprises a pair of frequency dividers (not illustrated). The frequency dividers divide or scale a frequency of the output signals (i.e., the stimulus signals $S_1$, $S_2$) of the first and second synthesizers 200, 200'. In some embodiments, frequency scaling is employed to one or both of reduce phase noise in and increase a frequency resolution (e.g., reduce a step size) of the stimulus signals $S_1$, $S_2$.

Referring again to FIG. 1, the vector network analysis system 100 further comprises a multiport vector network analyzer (VNA) 120. The DUT 102 is connected to the ports of the multiport VNA 120 for measurement. The multiport VNA 120 samples and measures signals at various ports of the DUT 102. In particular, the multiport VNA 120 samples both the first and second stimulus signals $S_1$, $S_2$ that are applied to inputs of the DUT 102. The multiport VNA 120 further samples response signals (e.g., reflection and transmission responses) received from the DUT 102. Various ratios computed using samples of various ones of the response signals and the applied first and second stimulus signals $S_1$, $S_2$ are used to determine measured S-parameters for the DUT 102. In some embodiments, the ratios are computed according to conventional methods.

In some embodiments, the multiport VNA 120 comprises a multi-channel acquisition module 122. The multi-channel acquisition module 122 is also referred to variously as a multi-channel test set or a multi-channel receiver module.

The multi-channel acquisition module 122 may have essentially any number of test ports, the number being equal to or greater than two. For example, the multi-channel acquisition module 122 may comprise three test ports in some embodiments. In another example, the multi-channel acquisition module 122 comprises eight test ports in some embodiments. The multi-channel acquisition module 122 illustrated in FIG. 1 comprises four test ports labeled, "port-1", "port-2", "port-3", and "port-4", respectively, for example and not by way of limitation.

The multi-channel acquisition module 122 receives and samples the first and second stimulus signals $S_1$, $S_2$ to create first and second sampled signals, respectively. The first and second stimulus signals $S_1$, $S_2$ are then routed by the multi-channel acquisition module 122 to a pair of test ports (e.g., port-1 and port-2) of the multi-channel acquisition module 122. The DUT 102 may be connected to the test port pair such that the first and second stimulus signals $S_1$, $S_2$ are applied to input ports 1 and 2 of the DUT 102, as illustrated in FIG. 1, or equivalently, to a differential or balanced input port of the DUT 102, as further described below. The multi-channel acquisition module 122 further receives and samples signals reflected from the input ports 1 and 2 of the DUT 102 in response to the applied first and second stimulus signals $S_1$, $S_2$ to produce sampled reflected signals. In some embodiments, the reflected signals are received by the same test port pair (e.g., port-1 and port-2) of the multi-channel acquisition module 122 that applied the first and second signals $S_1$, $S_2$ to the DUT 102.

In some embodiments, the multi-channel acquisition module 122 receives and samples signals transmitted from output ports of the DUT 102 or equivalently, a differential or balanced output port of the DUT 102, as further described below. For example, the multi-channel acquisition module 122 may provide one or more additional test ports (e.g., port-3, port-4, port-5, etc.) that may be connected to the DUT 102. As noted above, the embodiment of the multi-channel acquisition module 122 illustrated in FIG. 1 provides four test ports. Furthermore, the exemplary DUT 102 is illustrated with a pair of input ports and a pair of output ports. As illustrated in FIG. 1, the output ports 3 and 4 of the DUT 102 are connected to port-3 and port-4 of the multi-channel acquisition module 122, respectively, in accordance with some embodiments. The multi-channel acquisition module 122 receives and samples signals transmitted from the output ports 3 and 4 of the DUT 102 in response to the applied first and second stimulus signals $S_1$, $S_2$ to produce sampled transmitted signals. As illustrated, the pair of input ports of the DUT 102 is collectively designated as a balanced input port, while the pair of output ports of the DUT 102 is collectively designated as a balanced output port. While illustrated as having four ports by way of example, the embodiments of the present invention are not limited to a four-port DUT 102. In general, the DUT 102 may have any number of ports, various pairs of which may be designated as balanced ports while other ports may be single-ended ports, according to various embodiments of the present invention.

The multi-channel acquisition module 122 further comprises a plurality of receivers (not illustrated) that measure the various sampled signals. For example, a receiver may down-convert and then digitize a sampled signal to measure the signal. In some embodiments, the exemplary receivers may be each dedicated to a particular sampled signal. Thus, a first receiver measures the sampled first signal $S_1$ from the offset stimulus source 110, a second receiver measures the sampled second signal $S_2$ from the offset stimulus source 110, a third receiver measures a sampled reflected signal from a first input port of the DUT 102, and so on. In other embodiments, receivers may be switched among the test ports and are not dedicated to a particular sampled signal for various sampled signal measurements.

Figure 7:
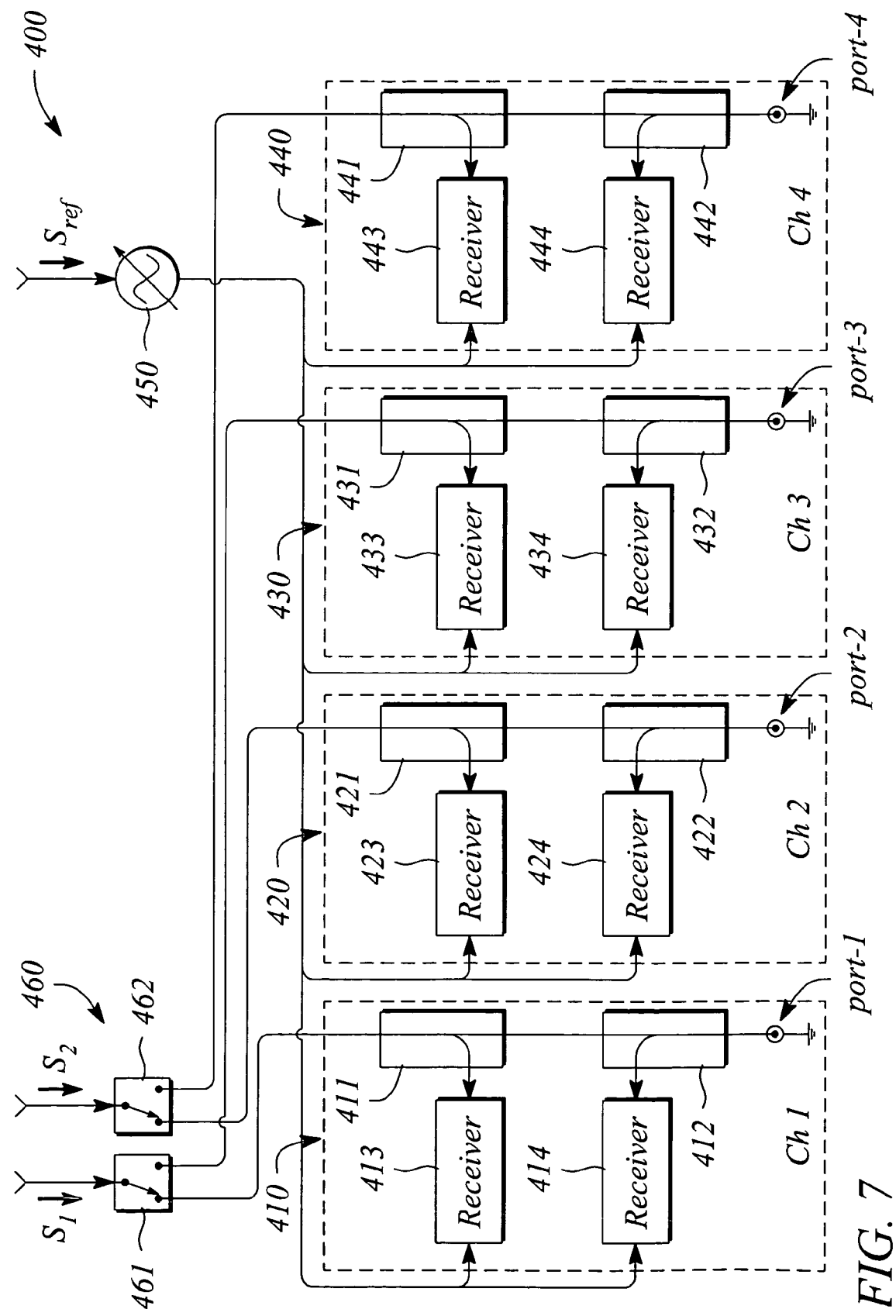
FIG. 7 illustrates a block diagram of a multi-channel acquisition module (MAM) according to an embodiment of the present invention.

FIG. 7 illustrates a block diagram of a multi-channel acquisition module (MAM) 400 according to an embodiment of the present invention. In particular, the MAM 400 provides four test ports and eight dedicated receiver channels, two receiver channels for each of the test ports. In some embodiments, the MAM 400 illustrated in FIG. 7 may be employed as the multi-channel acquisition module 122 of the vector network analysis system 100 in FIG. 1.

As illustrated in FIG. 7, the MAM 400 comprises four acquisition channels, each of which provides a separate test port. Specifically, a first acquisition channel 410, labeled 'Ch 1', provides a first test port, labeled 'port-1'; a second acquisition channel 420, labeled 'Ch 2', provides a second test port, labeled 'port-2'; a third acquisition channel 430, labeled 'Ch 3', provides a third test port, labeled 'port-3'; and a fourth acquisition channel 440, labeled 'Ch 4', provides a fourth test port, labeled 'port-4'. The acquisition channels 410, 420, 430, 440 and associated test ports are adapted to provide a pair of stimulus signals (e.g., $S_1$ and $S_2$) to, and receive response signals from, ports of a device under test (DUT).

When testing a balanced DUT having a first balanced port (e.g., balanced input port) and a second balanced port (e.g., balanced output port), the acquisition channel test ports (hereinafter 'test ports' for simplicity) may be grouped in sets, such as in pairs, to produce balanced test ports. For example, port-1 and port-2 of the test ports may be grouped as a first balanced test port while port-3 and port-4 are grouped as a second balanced test port. When grouped, one balanced test port (e.g., port-1 and port-2) acts as a stimulus port that provides the stimulus signals $S_1$, $S_2$ to and receives a reflected response signal(s) from the DUT. The other balanced test port (e.g., port-3 and port-4) receives a transmission response signal(s) from the DUT. As illustrated in FIG. 7, the MAM 400 facilitates either of the balanced test ports acting as the stimulus port.

Each acquisition channel 410, 420, 430, 440 of the MAM 400 comprises a pair of directional couplers for sampling signals going to and coming from respective test ports. A first directional coupler 411, 421, 431, 441 of each pair samples a stimulus signal going to the test port of the respective acquisition channel. A second direction coupler 412, 422, 432, 442 of the respective pair samples a signal coming from the test port of the respective acquisition channel. For example, a first stimulus signal $S_1$ passing through the first acquisition channel 410 is sampled by the first directional coupler 411, after which the first stimulus signal $S_1$ exits port-1 to be applied to the DUT. A response signal entering port-1 (e.g., a reflection from a DUT port) is sampled by the second directional coupler 412 of the pair in acquisition channel 410. The response signal may be either of a reflection response signal or a transmission response signal from the DUT, for example.

Each acquisition channel 410, 420, 430, 440 further comprises a pair of receivers that receive and measure signals applied thereto. In each acquisition channel 410, 420, 430, 440, a respective first receiver 413, 423, 433, 443 of each pair is connected to and receives a sampled signal from a respective one of the first directional coupler 411, 421, 431, 441. Similarly, a respective second receiver 414, 424, 434, 444, of each pair is connected to and receives a sampled signal from a respective one of the second directional coupler 412, 422, 432, 442. For example, a sampled stimulus signal from the first directional coupler 411 is received and measured by the first receiver 413 of the acquisition channel 410. Similarly, a sampled response signal from the second directional coupler 412 is received and measured by the second receiver 414 of the acquisition channel 410.

In the embodiment illustrated in FIG. 7, there are two receivers employed with each acquisition channel (i.e., eight receivers and four acquisition channels). In some embodiments (not illustrated), there may be fewer receivers employed than the number of acquisition channels. For example, four receivers may be employed with five or six acquisition channels. In such embodiments, one or more of the acquisition channels may comprise a pair of directional couplers and a pair of receivers, as described above, while others of the acquisition channels may comprise a pair of directional couplers and either a single receiver or no receiver, for example. In such embodiments, one or more of the four receivers may be shared among one or more of the acquisition channels. For example, a switch may be employed to selectively connect a shared receiver to a selected one of a plurality of acquisition channels. In yet other embodiments (not illustrated), an acquisition channel may comprise a receiver and no couplers. For example, an acquisition channel that is adapted to receive a response signal, such as a transmission response signal from the DUT, but not to apply a stimulus signal may be implemented without couplers. One skilled in art can readily devise any number of combinations of couplers, receivers and switches, as well as a variety of configurations wherein elements are shared among the acquisition channels, without departing from the scope of the present invention.

The MAM 400 further comprises a local oscillator (LO) 450. The LO 450 produces an LO signal that is applied to each of the acquisition channels 410, 420, 430, 440. In particular, the LO signal is applied to each of the respective receivers 413, 414; 423, 424; 433, 434; 443, 444 within the acquisition channels 410, 420, 430, 440. In some embodiments, the LO 450 is a phase locked source that is locked to a reference signal $S_{ref}$. For example, the reference signal $S_{ref}$ may be from a reference source, such as the reference source 116 of the offset stimulus source 110 or the reference source 330 of the offset frequency source 300, depending on the embodiment.

The MAM 400 further comprises a plurality of switches 460 adapted to selectively route various stimulus signals to selected sets of the acquisition channels 410, 420, 430, 440. As illustrated in FIG. 7, a first single pole, double throw (SP2T) switch 461 of the plurality 460 selectively routes the first stimulus signal $S_1$ to either the first acquisition channel 410 or the third acquisition channel 430 of a first set, for example. A second SP2T switch 462 of the plurality 460 selectively routes the second stimulus signal $S_2$ to either the second acquisition channel 420 or the fourth acquisition channel 440 of a second set, for example. When the switches 461, 462 are configured to route the stimulus signals $S_1$, $S_2$ to the first and second acquisition channels 410, 420, port-1 and port-2 comprise a balanced stimulus test port of the multi-channel acquisition module 400. Alternatively, when the switches 461, 462 are configured to route the stimulus signals $S_1$, $S_2$ to the third and fourth acquisition channels 430, 440, port-3 and port-4 comprise the balanced stimulus test port of the MAM 400.

The MAM 400 is illustrated in FIG. 7 and described in terms of four acquisition channels 410, 420, 430, 440, for simplicity of discussion herein and not by way of limitation. In actuality, the MAM 400 may comprises essentially any number of acquisition channels including, but not limited to, three (3), four (4), five (5), six (6), seven (7), eight (8), nine (9) and ten (10) channels, for example, and still be within the scope of the various embodiments of the present invention.

Figure 8:
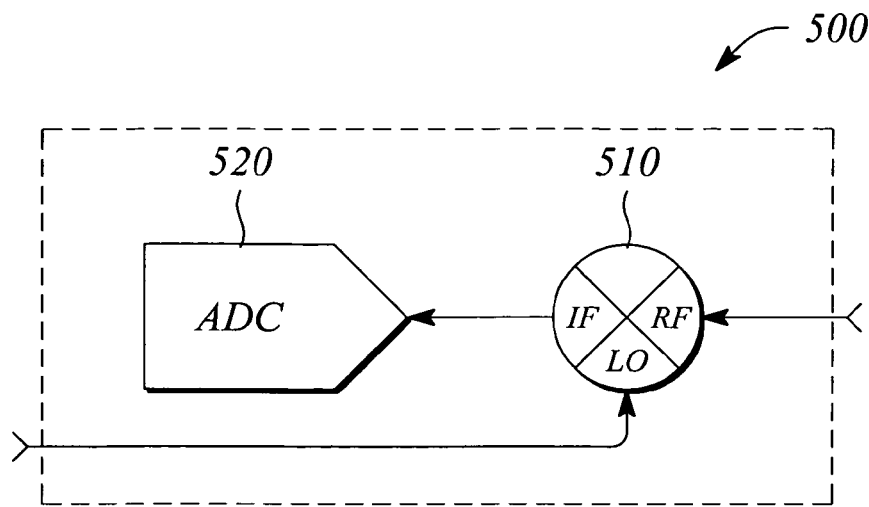
FIG. 8 illustrates a block diagram of a receiver channel according to an embodiment of the present invention.

FIG. 8 illustrates a block diagram of a receiver channel 500 according to an embodiment of the present invention. In some embodiments, one or more of the first receivers 413, 423, 433, 443 and the second receivers 414, 424, 434, 444 are implemented as the receiver channel 500.

The receiver channel 500 comprises a mixer 510 connected to an analog to digital converter (ADC) 520. The mixer 510 comprises a radio frequency (RF) port, a local oscillator (LO) port and an intermediate frequency (IF) port. The IF port is connected to an input of the ADC 520. The RF port is connected to a first input of the receiver channel 500 and the LO port is connected to a second input of the receiver channel 500. The receiver channel 500 receives an input signal at the first input, which is applied to the RF port of the mixer 510. The mixer 510 downconverts the received input signal to an intermediate frequency (IF) signal and applies the IF signal to the IF port. The downconversion employs a local oscillator (LO) signal that is received at the second input of the receiver channel 500 and is applied to the LO port of the mixer 510. The ADC 520 receives, samples and digitizes the IF signal to produce a measured result or measured data for the receiver channel 500. In some embodiments, the measured data produced by the receiver channel 500 is communicated via a data bus or equivalent communication means to a data processor or a controller (not illustrated in FIG. 8) for further processing.

A timing of the sampling performed by the ADC 520 may be controlled. In some embodiments, the ADC 520 is controlled by a data processor or a controller via a control bus or equivalent communication means (not illustrated in FIG. 8). In general, the ADC 520 may sample and digitize the IF signal at a plurality of times within a period of the signal. In some embodiments, a timing of sampling by the ADC 520 is synchronized with a performance of an offset source, such as one or both of the offset stimulus source 110 and the offset frequency source 300 described above. For example, the sampling by the ADC 520 may be synchronized such that the samples (or sample times) correspond to a timing of one or more desired phase relationships between the stimulus signals $S_1$, $S_2$ (e.g., corresponding to Point A, Point B, etc., illustrated in FIG. 2A).

Moreover, when the receiver channel 500 is employed as one or more of the respective receivers 413, 414, 423, 424, 433, 434, 443, 444 of the plurality of acquisition channels 410, 420, 430, 440, a timing of sampling among the ADCs 520 of various others of the individual receivers 413, 414, 423, 424, 433, 434, 443, 444 may be synchronized with one another. In other words, a timing of a sample in the ADCs 520 in respective receivers 413, 414 of the first acquisition channel 410 is synchronized with one another. Further, in some embodiments, a timing of a sample in the first acquisition channel 410 is further synchronized with those other acquisition channels 420, 430, 440 when the receiver channel 500 is employed as the respective receivers in acquisition channels 420, 430, and 440.

Referring again to FIG. 1, in some embodiments, the multi-channel acquisition module 122 is essentially a conventional multiport test set known in the art except that the multi-channel acquisition module 122 accepts and distributes to the DUT 102 the first and second signals $S_1$, $S_2$. For example, the multi-channel acquisition module 122 may be a conventional multiport test set or acquisition portion of a conventional VNA that is modified to accept a pair of stimulus signals instead of a single stimulus signal typical for such test sets or VNAs. For example, a single-pole-four-throw (SP4T) switch that is used to route the single stimulus signal to each of four ports of a conventional multiport test set may be replaced by the pair 460 of the SP2T switches 461, 462 to route the first and second stimulus signals $S_1$, $S_2$ to pairs of test ports, as illustrated in FIG. 7.

In some embodiments, the multiport VNA 120 further comprises a data processor 124. The data processor 124 processes the measured signals produced by the multi-port acquisition module 122 to generate measured characteristics for the DUT 102. For example, the data processor 124 may receive digitized sampled signals from the multi-channel acquisition module 122 and compute mixed mode S-parameters for the DUT 102. In some embodiments, the data processor 124 is a digital signal processor (DSP). In some embodiments, a hardware-based DSP is employed. In other embodiments, the DSP is implemented in software.

In some embodiments, the multiport VNA 120 further comprises a controller 126. The controller 126 provides control of the multi-port acquisition module 122 and the data processor 124. In some embodiments, the controller 126 further provides control of the offset stimulus source 110 (or the offset frequency source 300 of FIG. 6). In some embodiments, the controller 126 further provides a user interface including, but not limited to, buttons, knobs, a keypad and a display unit, to enable a user to control an operation of the VNA 120 as well as view measurement results. In some embodiments, the controller 126 and the data processor 124 may be implemented as portions of a general purpose computer of the VNA 120. In some embodiments, the VNA 120 comprises the offset stimulus source 110.

The vector network analysis system 100 is calibrated in a manner similar to a conventional VNA in that Short-Open-Load-Thru (SOLT), Transmission-Reflection-Load (TRL), and related calibration methodologies may be employed with modification. In particular, the modification relates to establishing a known phase relationship between the stimulus signals $S_1$, $S_2$ prior to performing a conventional calibration (e.g., using SOLT or TRL methodology).

For example and not by way of limitation, consider an exemplary calibration of the vector network analysis system 100 of the present invention employing the offset frequency source 300 of the present invention as the offset stimulus source 110 of the vector network analysis system 100. Further, assume that a 4-port multi-channel acquisition module 122, such as the MAM 400 of the present invention, as described above, is being used with the vector network analysis system 100.

At a beginning of the exemplary calibration, port-1 and port-2 of the MAM 400 are terminated by a matched load (e.g., 50 OHM termination for a 50-Ohm vector network analysis system 100) and a calibration of the phase comparator 312 is performed (i.e., in the phase offset controller 310 portion of the offset frequency source 300). To perform the phase comparator 312 calibration, the first synthesizer 200 is phase locked to the reference source 330. An output frequency $f_1$ of the first synthesizer 200 is set to a frequency F (i.e., $f_1 = F$). The second synthesizer 200' is similarly phase locked to the reference source 330 and set to an output frequency $f_2$ equal to the frequency F plus or minus a frequency difference $\Delta F$ ($f_2 = F \pm \Delta F$). The frequency difference $\Delta F$ produces a beat tone at the output of the phase comparator 312 (e.g., mixer 312) that is represented by a sine wave having a frequency $\Delta F$. During the calibration, an output of the integrator 318 portion of the phase offset controller 310 is temporarily disabled. For example, the output of the integrator 318 may be disconnected from the summer 250 in the second synthesizer 200' using a switch (not illustrated) to temporarily open the connection with the summer 250.

An amplitude of a phase difference signal produced by the phase comparator 312 determines a sensitivity of the phase comparator 312. The amplitude is measured (e.g., digitized) using the loop ADC 319 portion of the phase offset controller 310 and stored in a memory of the vector network analysis system 100. The digitized and stored amplitude measurement is used later as calibration data for the phase detector 312 at frequency F. As long as a power level of an output of either of the first frequency synthesizer 200 or the second frequency synthesizer 200' does not change, the phase comparator 312 calibration represented by the calibration data is considered stable. The output power levels of the first and second synthesizers 200, 200' may be controlled, such that the level does not change, by using a saturated amplifier to drive the respective phase comparators 230 of the synthesizers 200, 200', for example. In some embodiments, the calibration of the phase comparator 312 portion of the phase offset controller 310 is repeated at each frequency F in a range of frequencies over which the first and second synthesizers 200, 200' are to be operated.

After the phase comparator 312 calibration, as described above, the synthesizers 200, 200' are set and phase locked at the same frequency F. In other words, the difference frequency $\Delta F$ is set to approximately zero. The output of the integrator 318 portion of the phase offset controller 310 is enabled (e.g., the output is reconnected to the summer 250 by closing the switch). When enabled, a phase difference between the first stimulus signal $S_1$ and the second stimulus signal $S_2$ automatically adjusts to be equal to that specified by the offset goal signal from the loop DAC 316 portion of the phase offset controller 310. The loop DAC 316 is set to produce an offset goal signal representing a number of separate and distinct phase difference values. For example, three or more different phase difference values may be set using the DAC 316.

At each separate and distinct phase difference value, a relative phase between the stimulus signals $S_1$, $S_2$ that is applied to the output test ports of the VNA is measured. For example, with the output ports designated as port-1 and port-2, a relative phase of the stimulus signals $S_1$, $S_2$ is sampled by directional couplers 411 and 421 and measured using receivers 413 and 423 of the acquisition channels 410 and 420, respectively. Similarly, with the output test ports of the VNA designated as port-3 and port-4, a relative phase of the stimulus signals $S_1$, $S_2$ is sampled by directional couplers 431 and 441 and measured using receivers 433 and 443 of the acquisition channels 430 and 440, respectively. The stimulus signals $S_1$, $S_2$ may be routed to either port-1 and port-2 or port-3 and port-4 using the pair of switches 460 of the MAM 400, for example. The relative phase is measured for a number of input values to the loop DAC 316 and a relationship between the loop DAC 316 input value and the relative phase may be determined from the measurements of the relative phase. The relationship represents a calibration of the loop DAC 316.

A combination of the phase comparator 312 calibration and the loop DAC 316 calibration establishes the offset phase relationship between the stimulus signals $S_1$, $S_2$ in accordance with the present invention. As such, a full four port calibration of the vector network analysis system 100, using a conventional VNA calibration, may be performed for each of the stimulus signals $S_1$, $S_2$ using the established offset phase relationship (hereinafter 'offset stimulus signals $S_1$, $S_2$', for simplicity and not by way of limitation). After the calibration of the vector network analysis system 100 is completed using the offset stimulus signals $S_1$, $S_2$ according to the present invention, a DUT may be measured using the calibrated vector network analysis system 100. An example of measuring a DUT is described below.

To measure a balanced DUT 102, ports of the DUT 102 are connected to ports of the vector network analysis system 100. For example, the DUT 102 may be connected as illustrated in FIG. 1 and the loop DAC 316 set to any arbitrary constant value. While constant for the example, the loop DAC 316 setting may be swept or otherwise varied during measurement of the DUT 102 to examine in more detail a performance of the DUT 102 at particular phase offsets. The frequency synthesizers 200, 200' of the offset frequency source 300 (i.e., the offset stimulus source 110) are set to have the difference frequency $\Delta F$ between the established offset stimulus signals $S_1$, $S_2$. The offset stimulus signals $S_1$, $S_2$ are routed and applied to the ports of the DUT 102. Samples of signals one or more of incident upon (e.g., the offset stimulus signals $S_1$ and $S_2$), reflected from and transmitted through (e.g., response signals) the ports of the DUT 102 are measured using the multi-channel acquisition module 122 (e.g., the acquisition channels 410, 420, 430 and 440 of the MAM 400). Specifically, the samples are measured at multiple points within a period of the difference frequency ΔF such that at least target modes (e.g., common mode and difference mode) are measured. Sampling is repeated at each frequency F at which the DUT 102 is measured. Performance parameters, such as S-parameters and mixed mode S-parameters, are then computed using the measured samples according to conventional techniques and the offset stimulus signal $S_1$, $S_2$ phase relationships established according to the invention and associated with the various samples.

Figure 9:
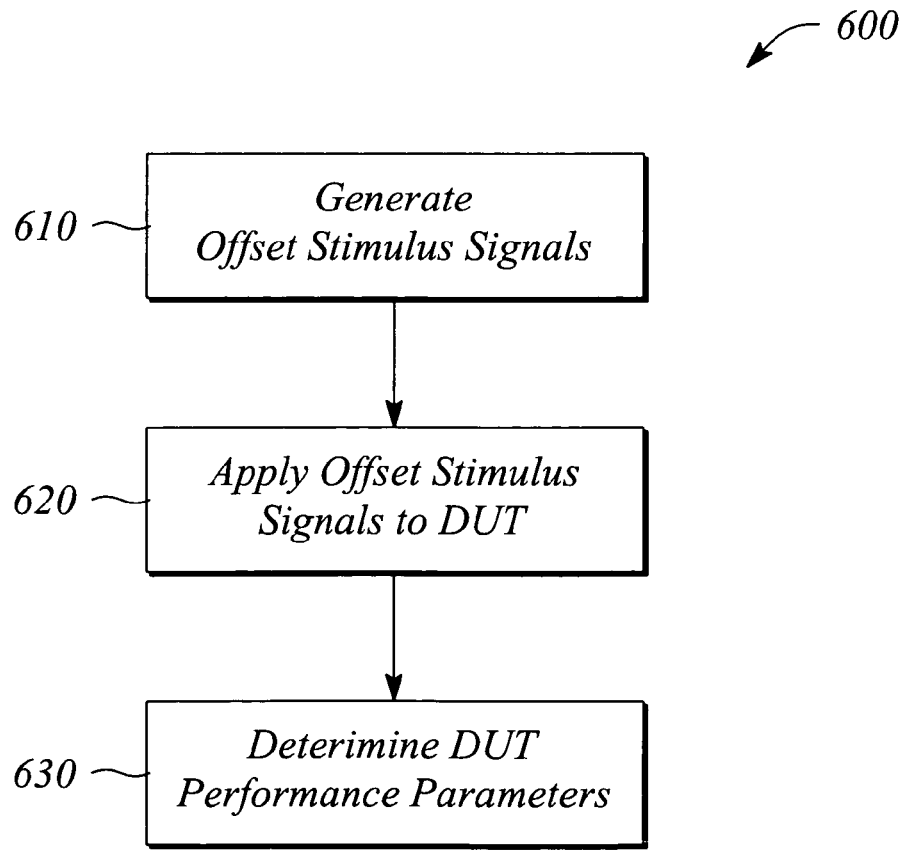
FIG. 9 illustrates a flow chart of a method of measuring a balanced device under test using offset stimulus signals according to an embodiment of the present invention.

FIG. 9 illustrates a flow chart of a method 600 of measuring a balanced device under test (DUT) using offset stimulus signals according to an embodiment of the present invention. In some embodiments, the method 600 employs the vector network analysis system 100 described above. The method 600 of measuring comprises generating 610 offset stimulus signals. In some embodiments, a plurality of the offset stimulus signals is generated 610. In some embodiments, the plurality of offset stimulus signals is generated 610 in a phase-coherent manner (e.g., using phase-locked sources locked to a common reference).

For example, generating 610 may result in a pair of stimulus signals $S_1$, $S_2$. In various embodiments, a first stimulus signal $S_1$ of the pair is offset one or both of in frequency and in phase relative to a second stimulus signal $S_2$ of the pair. The relative offset may be constant or time-varying. For example, the second signal $S_2$ may have a frequency that is offset relative to a frequency of the first signal $S_1$. In another example, the second signal $S_2$ may have a phase that is offset as a function of time (i.e., time-varying phase offset) relative to a phase of the first signal $S_1$. In yet another example, a relative frequency offset between the first and second signals $S_1$, $S_2$ may vary as a function of time. In some embodiments, the offset stimulus signals $S_1$, $S_2$ are generated 610 by employing the offset stimulus source 110 or the offset frequency source 300 described above.

The method 600 of measuring further comprises applying 620 the offset stimulus signals to a balanced port of a balanced DUT. For example, the pair of offset signals $S_1$, $S_2$ may be applied 620 to a balanced or differential input port of the DUT. The balanced DUT has at least one balanced or differential port. The balanced or differential port may comprise a pair of single ended ports operating as a balanced port, for example.

The method 600 of measuring further comprises determining 630 DUT performance parameters using the applied offset stimulus signals. In some embodiments, determining 630 comprises measuring the offset stimulus signals applied 620 to the DUT and further comprises measuring one or more response signals from the DUT. In some embodiments, the measurements of the stimulus signals and the response signals is performed in a synchronized manner. By 'synchronized', it is meant that each of the measurements is taken essentially simultaneously. The measurements portion of determining 630 may employ the vector network analysis system 100 or the MAM 400 described above, for example.

Determining 630 further comprises computing performance parameters from the measurements. In some embodiments, ratios of the measurements are computed to determine one or both of single ended S-parameters and mixed mode S-parameters. Computing may be performed using the data processor 124 described above with respect to the vector network analysis system 100.

Thus, there have been described embodiments of a vector network analysis system, an offset stimulus signal source and a method of measuring a balanced device using offset stimulus signals. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. The vector network analysis system comprising:
an offset stimulus source providing first and second stimulus signals, the first stimulus signal being offset from the second stimulus signal in one or both of frequency and time-varying phase; and
a vector network analyzer having at least four ports, the offset stimulus source configured to present the first and second stimulus signals at two of the ports of the vector network analyzer, wherein the vector network analyzer is configured to measure performance parameters at two ports of the vector network analyzer,
wherein the offset stimulus source comprises:
a first frequency source producing the first stimulus signal of the plurality;
a second frequency source producing the second stimulus signal of the plurality that is offset from the first stimulus signal, the second frequency source comprising a summer connected between an input and an output of the second frequency source,
a reference signal source connected between an input of the first frequency source and the input of the second frequency source; and
a phase offset controller connected between an output of the first frequency source and the output of the second frequency source, the phase offset controller having an output connected to an input of the summer.

2. An offset stimulus source that stimulates a device under test, the offset stimulus source comprising:
a first signal source providing a first stimulus signal; and
a second signal source providing a second stimulus signal, wherein the second stimulus signal is offset in one or both of frequency and time-varying phase from the first stimulus signal, the first stimulus signal and the second stimulus signal providing stimulation to a balanced input port of the device under test to determine performance parameters for the device under test
further comprising:
a reference signal source connected between an input of the first signal source and an input of the second signal source; and
a phase offset controller connected between an output of the first signal source and an output of the second signal source,
wherein the second signal source comprises a summer connected between the input and the output of the second signal source, the phase offset controller having an output connected to an input of the summer.

* * * * *